United States Patent
Ito et al.

(10) Patent No.: US 6,503,816 B2
(45) Date of Patent: Jan. 7, 2003

(54) THIN FILM FORMATION BY INDUCTIVELY-COUPLED PLASMA CVD PROCESS

(75) Inventors: Norikazu Ito, Tokyo (JP); Yoshimi Watabe, Kunitachi (JP); Akihisa Matsuda, 3-2-8 Nishine-minami, Tsuchiura, Ibaraki (JP); Michio Kondo, 4-424-104 Matsushiro, Tsukuba, Ibaraki (JP)

(73) Assignees: National Institute of Advanced Industrial Science and Technology, Tokyo (JP); Anelva Corporation, Fuchu (JP); Akihisa Matsuda, Ibaraki (JP); Michio Kondo, Ibaraki (JP)

( * ) Notice: Subject to any disclaimer, the term of this patent is extended or adjusted under 35 U.S.C. 154(b) by 0 days.

(21) Appl. No.: 09/832,860

(22) Filed: Apr. 12, 2001

(65) Prior Publication Data

US 2001/0031542 A1 Oct. 18, 2001

(30) Foreign Application Priority Data

Apr. 13, 2000 (JP) ........................................ 2000-112693
Sep. 4, 2000 (JP) ........................................ 2000-267554

(51) Int. Cl.$^7$ .......................... H01L 21/20; H01L 21/36
(52) U.S. Cl. ........................................ 438/485; 438/503
(58) Field of Search ........................... 156/345, 345.48; 118/723 I, 723 IR; 438/482, 485, 488, 503

(56) References Cited

U.S. PATENT DOCUMENTS 5,449,412 A * 9/1995 Pinneo ................. 118/723 MP
5,891,349 A * 4/1999 Tobe et al. .................... 216/68

FOREIGN PATENT DOCUMENTS

| JP | 4-236781 | 8/1992 |
| JP | 7-94421 | 4/1995 |
| JP | 2785442 | 5/1998 |

* cited by examiner

Primary Examiner—Michael Sherry
Assistant Examiner—Asok Kumar Sarkar
(74) Attorney, Agent, or Firm—Burns, Doane, Swecker & Mathis, LLP (57) ABSTRACT

A thin film forming method and apparatus forms a thin film having an excellent thickness uniformity over a substrate, particularly a large-area substrate. The thin film forming method and apparatus includes a film forming chamber in which an inductive coupling electrode having a feeding portion and a grounding portion at its two ends is arranged, a high-frequency power source for feeding a high-frequency power to the feeding portion, and a waveform generator for amplitude-modulating the high-frequency power outputted from the high-frequency power source. The amplitude-modulated high-frequency power is fed to the inductive coupling electrode to generate a plasma so that a thin film may be formed on a substrate arranged to face the inductive coupling electrode.

23 Claims, 8 Drawing Sheets

THIN FILM FORMATION BY INDUCTIVELY-COUPLED PLASMA CVD PROCESS

BACKGROUND OF THE INVENTION

1. Field of the Invention

The present invention relates to a thin film forming method, a thin film forming apparatus and a solar cell and, more particularly, to a thin film forming method and apparatus for forming a thin film of a-Si or the like having an excellent thickness uniformity over a large-sized substrate.

2. Related Art

A solar cell has been noted and expected as a clean energy source, but its cost reduction is indispensable for its spread. It has, therefore, been earnestly desired to provide a thin film forming apparatus which can uniformly form an a-Si film over a large-sized substrate at a high throughput.

For forming a thin film such as an a-Si film, there has been widely used a parallel-plate (or capacitive coupling type) plasma-assisted CVD reactor. However, this reactor has a disadvantage of low throughput because each run usually processes one substrate. In contrast, the reactor to simultaneously process a plurality of substrates may become extremely large. In addition, a large-seized solar cell having desired characteristics can be hardly manufactured since the film thickness uniformity is seriously lowered with increasing the size of substrate.

A variety of investigations have been made in order to generate a uniform plasma all over the substrate and then form thin films with high thickness uniformity. However, it was found very difficult to generate uniform plasma over a large-sized substrate, which is attributed to the fundamental disadvantages of this method as will be mentioned below.

First, this method requires the precise arrangement of two plate electrodes with a prescribed distance all over the electrodes to generate uniform plasma, which is practically difficult as the substrate is larger.

Then, when the high-frequency power is fed to the electrode, the discharge takes place between the high-frequency driven electrode and grounded opposite electrode and walls of a film forming chamber. This discharge causes the self-bias potential on the electrode and to lower the uniformity of plasma density as described in Japanese Patent Laid-Open No. 7-94421.

In addition, as the electrodes are enlarged, the standing wave tends to be generated on the electrode surfaces, which also lowers the uniformity of plasma density. This plasma distribution becomes more noticeable when the VHF frequency or higher frequency is employed.

Under such a circumstance, there has been proposed another type of plasma CVD method using an inductive coupling electrode. This method is absolutely different in the mechanism for maintaining the plasma discharge from the capacitive coupling plasma CVD method; therefore, this method does not require precise arrangement of electrodes and is freed of the self-bias of the electrodes. In addition, a high-density plasma advantageous for high rate film formation can be obtained using the excitation frequency in the VHF band. The plasma CVD reactor using inductive coupling electrode is exemplified in Japanese Patent Laid-Open No. 4-236781 which employs a ladder-shaped electrode and in Japanese Patent No. 2785442 which employs a zigzagged-folded electrode.

During the investigations on a variety of inductive coupling electrodes including those having the aforementioned electrodes, the present inventors have found that as the size of inductive coupling electrodes such as the ladder-shaped or zigzag-folded electrodes is larger, the current flowing the electrode varies with the positions and the standing wave appears at unexpected positions. In short, it is difficult to create uniform plasma to cope with the large-sized substrate so far as electrode structures of the prior art are employed.

The investigation on the film uniformity using the inductive coupling electrode has been little made. On the other hand, a lot of investigations have been made to improve the film thickness uniformity in the case using the capacitive coupling electrode as described, for example, in Japanese Patent Laid-Open No. 7-94421. Here, in order to solve the problem of the distribution of plasma density caused by the self-bias potential on the electrode mentioned above, the high-frequency voltage is modulated to create intermittent discharge.

However, it is meaningless to apply the method that is effective for the capacitive coupling PCVD method to the inductive coupling PCVD because the mechanism for maintaining the discharge is absolutely different between the inductive coupling and the capacitive coupling PCVD. That is, in the capacitive coupling PCVD, the plasma discharge is maintained by the secondary electron emission from the electrodes and by the vibrations of the sheath. On the other hand, in the inductive coupling PCVD, the plasma discharge is maintained by the vibrations of the electromagnetic field which is fed from the electrodes. Therefore, the investigation results as to the capacitive coupling PCVD are not available in the inductive coupling PCVD.

Accordingly, the present inventors carried out fundamental investigations on the plasma homogenization using the inductive coupling electrodes and examined several electrode structure that positively utilizes the standing waves that caused the uniformity to deteriorate in the prior art inductive coupling electrodes. Here, a rod-shaped and a U-shaped electrode were used, which have a power feeding portion and grounding portion at the respective ends. The distance between the grounding portion and the feeding portion was set to be natural number multiple of a half wavelength of the high-frequency wave to establish the standing wave at predetermined positions over the electrode so that the predictable plasma distribution may be utilized to form the thin film with uniform thickness on the substrate.

These electrode structures apparently enables the improvement of the film thickness uniformity as compared with the prior art. However, it was also found that the plasma density varied from the feeding portion side to the grounding portion side of the electrode as the electrode is lengthened to process a large-sized substrate. The low plasma density near the grounding portion causes the film to be thin as compare with that of the feeding portion.

This phenomenon is thought to come from the fact that the high-frequency waves attenuate when propagating to the end portion of the electrode. Therefore, the present inventors have further investigated the apparatus construction and the film forming conditions to eliminate the plasma density distribution caused by the attenuation of the high-frequency power and as a result found the following facts. That is, the state of the plasma is changed by amplitude-modulating the high-frequency power in a similarly way as the capacitive coupling PCVD although the plasma maintaining mechanism is absolutely different from each other. The distribution of the plasma density is also changed by the modulation condition and these changes have repeatability.

It has been also found that in the case where a plurality of electrodes are arranged in parallel to form the thin film over a wide substrate, the film thickness distribution in the longitudinal direction of each electrode changes with the phase of the high-frequency power to be fed to electrodes.

The information is obtained for the first time by systematically investigating the film forming method using the inductive coupling electrodes, and the researches are further developed on the basis of the discoveries to clarify the relations between the feeding method and the modulation method, and the thin film distribution. Thus, the present invention has been accomplished.

SUMMARY OF THE INVENTION

An object of the present invention is to provide a thin film forming method and apparatus which make it possible to form a thin film having an excellent thickness uniformity over a large-sized substrate.

Another object of the invention is to provide a thin film forming method and apparatus which make it possible to form a thin film having excellent characteristics and thickness uniformity at high throughput.

Still another object of the invention is to fabricate a solar cell by using the aforementioned thin film forming method or apparatus and to provide a high-quality, low-cost solar cell.

According to the present invention, there is provided a thin film forming method comprising: the step of arranging an inductive coupling electrode having a power feeding portion and a grounding portion in a film forming chamber; and the step of feeding an amplitude-modulated high-frequency power to said feeding portion to generate a plasma to form a thin film over a substrate arranged to face the inductive coupling electrode.

By thus amplitude-modulating the high-frequency power to be fed to the inductive coupling electrode and by adjusting the modulation, it is possible to create the plasma having the desired density distribution and to form a thin film with a uniform thickness over a large-sized substrate. Under the various film forming conditions, the uniform plasma density distribution can be achieved by selecting the proper modulation method. For example, even under the condition for forming a high quality film at a high rate, the plasma density can be made uniform to form the thin film with uniform thickness.

Here, the "amplitude modulation" has a meaning including the pulse modulation.

In the present invention, for example, the amplitude modulation that cuts off the high-frequency power periodically is used. Moreover, the ratio of a period for feeding the high-frequency power is preferably varied. Still moreover, the modulation frequency of the amplitude modulation is preferably varied.

The inductive coupling electrode of the invention is properly exemplified by either an electrode having a shape folded at the center or a rod-shaped electrode. It is preferred that the frequency of the high-frequency power is changed to establish standing waves between the feeding portion and the folded portion of the inductive coupling electrode or between the feeding portion and the grounding portion.

Moreover, it is preferable that the inductive coupling electrode having the center-folded shape is disposed in plurality in parallel in a common plane, and that the high-frequency powers in anti-phase are fed to the adjacent feeding portions.

By thus arranging the plurality of inductive coupling electrodes folded at the center and by shifting the phase of the high-frequency power to be fed to the adjacent feeding portions by 180 degrees, the film thickness distribution not only in the widthwise direction of the substrate but also in the longitudinal direction of the electrodes can be improved. This makes it possible to form a thin film with uniform thickness over a larger substrate. Moreover, since the distribution of the plasma density changes with the conditions of amplitude modulation, as described before, the plasma density can be further homogenized for the various film forming conditions by selecting the proper modulation conditions and by feeding anti-phase high-frequency powers to the adjacent electrodes.

According to the invention, there is provided a thin film forming apparatus comprising: a film forming chamber in which an inductive coupling electrode having a feeding portion and a grounding portion at its two ends is arranged; a high-frequency power source for feeding a high-frequency power to the feeding portion; and a waveform generator for amplitude-modulating the high-frequency power outputted from the high-frequency power source, whereby the amplitude-modulated high-frequency power is fed to the inductive coupling electrode to generate a plasma so that a thin film may be formed on a substrate arranged to face the inductive coupling electrode. Moreover, in this invention, the apparatus construction in which a plurality of electrodes having a rod shape or a center-folded shape are arranged in a common plane is preferably used.

It is preferred that the distance between the feeding portion and the grounding portion of the rod-shaped electrode or between the feeding portion and the turning portion of the center-folded shape electrode is set to be natural number multiple of a half wavelength of the high-frequency wave. It is possible to generate and maintain the plasma more stably thereby and to reproducibly form a thin film having uniform thickness.

Moreover, the inductive coupling electrode having the center-folded shape is arranged in plurality in parallel in a common plane, and there is further comprised means for controlling the phase of the high-frequency power to be fed to the feeding portions such that the high-frequency waves in anti-phase are fed to the adjacent feeding portions of the plurality of inductive coupling electrodes.

The inductive coupling electrode planes are arranged in a plurality of layers, and substrates are arranged on the two sides of each electrode layer so that thin films may be simultaneously formed on the plurality of substrates. That is, by using the inductive coupling electrodes, the so-called "multi-zone film forming method" can be adopted, without inviting the enlargement of the apparatus unlike the case of the capacitive coupling electrode. Thus, a film forming apparatus which forms thin films simultaneously on a number of substrates can be constructed. As a result, the throughput can be drastically improved to lower the cost of e.g. the solar cell.

A solar cell of the present invention is manufactured to include at least one of its thin films formed by the aforementioned thin film forming method or thin film forming apparatus of the present invention.

According to the thin film forming apparatus and method of the present invention, as has been described hereinbefore, uniform thin films with various qualities can be prepared since the conditions for forming a high quality film at a high rate can be selected. The cost for manufacturing the solar cell can be lowered while keeping the high quality. By using the multi-zone film forming method, moreover, the higher throughput can be achieved, which contributes to further cost reduction of solar cells.

PREFERRED EMBODIMENTS OF THE INVENTION

The invention will be described in connection with its embodiments.

The thin film forming apparatus and method of the invention will be described with reference to FIG. 1.

Figure 1:
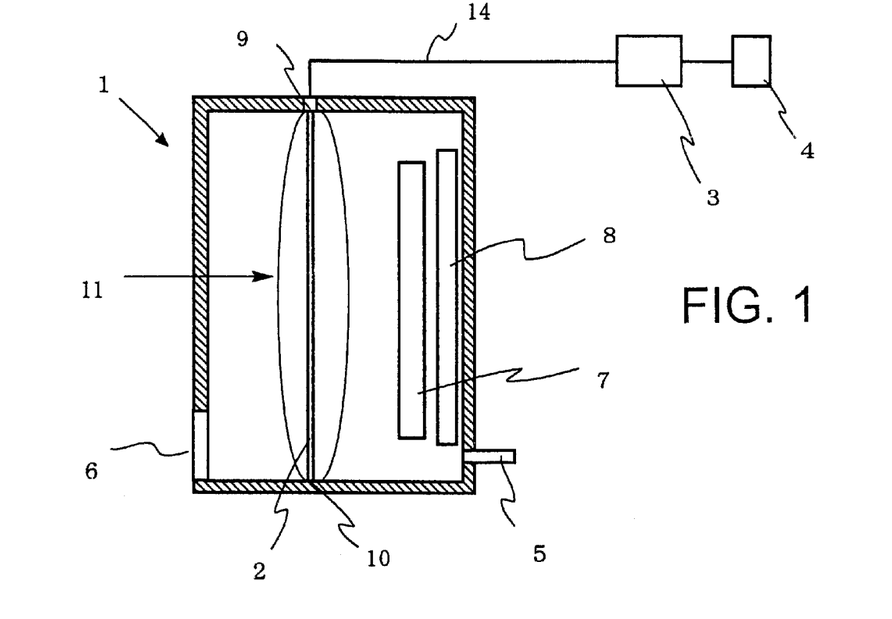
FIG. 1 is a schematic diagram showing one embodiment of a thin film forming apparatus of the invention.

In a film forming chamber 1 which is provided with a gas inlet 5 and an exhaust port 6, as shown in FIG. 1, there is arranged an inductive coupling electrode 2, one end of which is a grounding portion 10 connected to the wall of the film forming chamber in the earth potential, and the other end of which is a feeding portion 9 connected to a high-frequency power source 3 through a coaxial cable 14. To this high-frequency power source 3, there is connected a waveform generator 4 so that the high-frequency power to be outputted from the power source can be desirably amplitude-modulated. Here, numeral 7 designates a substrate, and numeral 8 designates a substrate heating heater.

The inductive coupling electrode 2 is provided at its two end portions with the feeding portion 9 and the grounding portion 10 as mentioned. The distance L between the feeding portion 9 and the grounding portion 10 is preferred to be n/2 times (n: a natural number) of an excitation wavelength $\lambda$ of the high-frequency power. In other words, the discharge can be stably established and maintained by setting the feeding portion, the grounding portion and the excitation wavelength to satisfy a relation of $L = n \cdot \lambda / 2$.

Here, the feeding portion need not always be disposed inside the film forming chamber but maybe disposed at a position of $L = n \cdot \lambda / 2$ outside of the film forming chamber by arranging the inductive coupling electrode through the film forming chamber. In contrast, the oscillatory frequency of the high-frequency power source may be made variable so that the frequency may be changed to satisfy the aforementioned equation for a predetermined value of the distance L.

The apparatus of FIG. 1 is constructed to arrange the single electrode. In the case where the substrate has a large width, however, a plurality of electrodes may be arrayed to correspond to the substrate width, as shown in FIG. 2, and may be individually fed with the high-frequency power.

Figure 3:
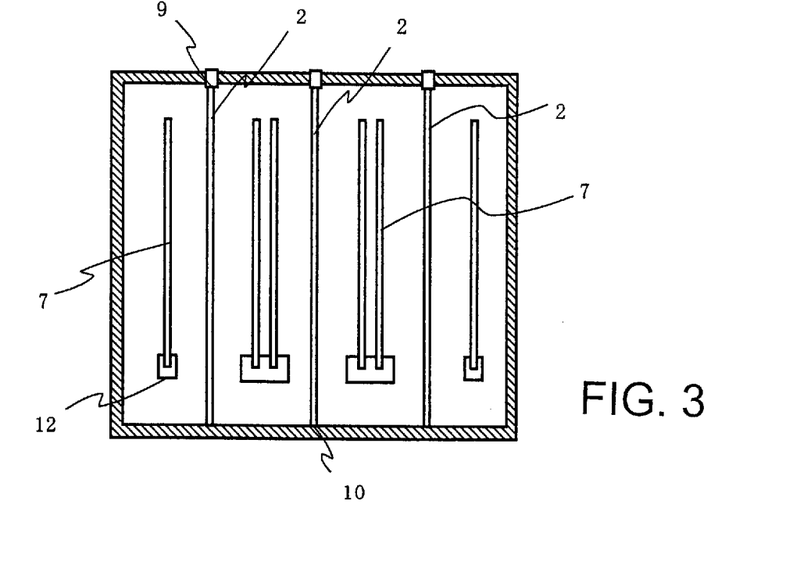
FIG. 3 is a schematic diagram showing one embodiment of a high-throughput thin film forming apparatus of the invention.

On the other hand, the thin film forming apparatus of the invention is preferably given a structure of a multi-zone film forming type, in which the electrodes arrayed in the substrate width in a common plane and then the electrode planes are arranged in a plurality of layers spaced at a predetermined interval, as shown in FIG. 3, so that the substrates may be arranged on the two sides of each electrode layer. With this construction, the thin films can be simultaneously formed on a multiplicity of substrates (or six in the shown embodiment), to raise the throughput drastically. Moreover, the distance between the electrodes and the substrates can be made as small as about 30 to 60 mm to form the films simultaneously over the numerous substrates in the small space. It is, therefore, possible to realize a thin film forming apparatus which has an excellent throughput ratio to the installation area of the apparatus.

Figure 2:
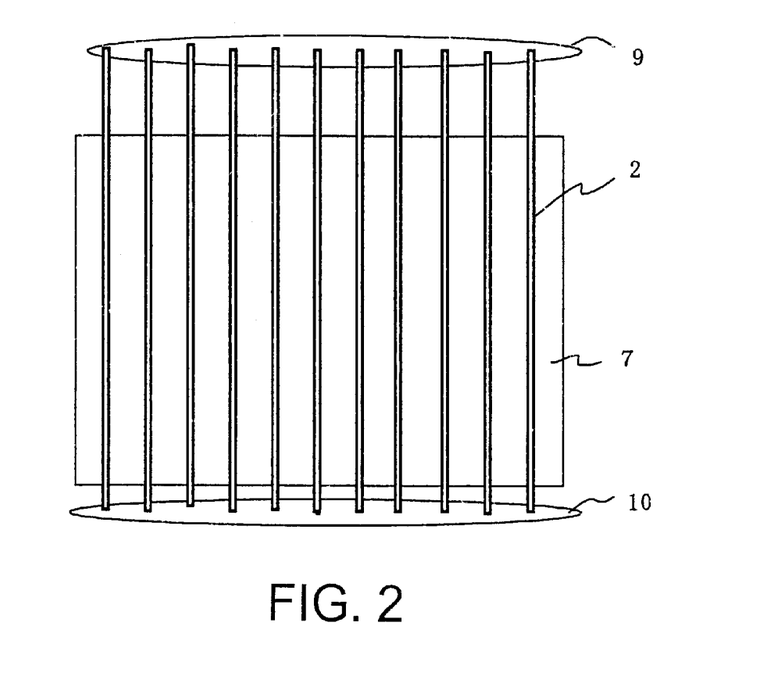
FIG. 2 is a schematic diagram showing one example of an inductive coupling electrode of the invention.
Figure 8:
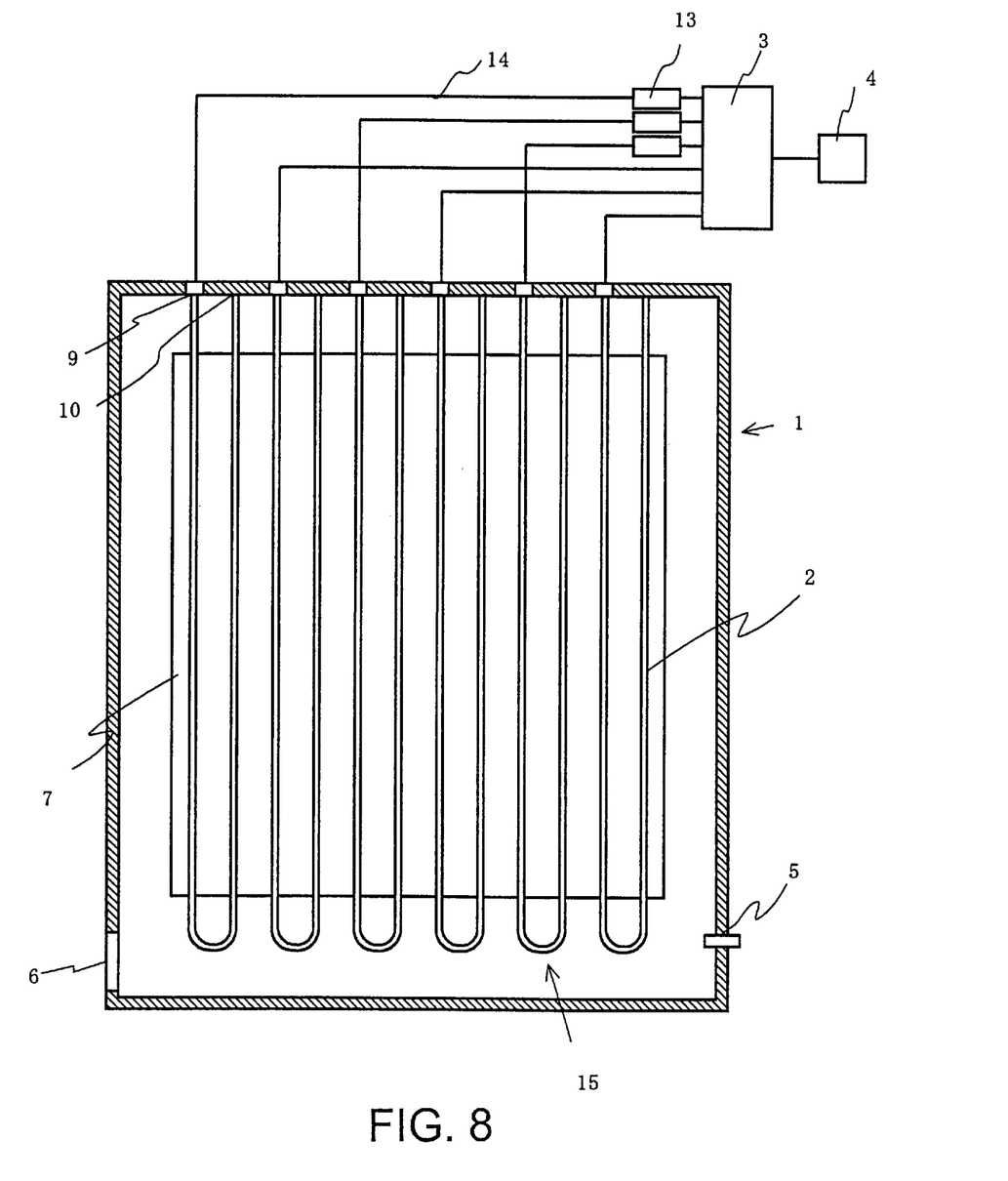
FIG. 8 is a schematic diagram showing another embodiment of a thin film forming apparatus of the invention.

Here, in FIGS. 1 to 3, there have been used the rod-shaped electrodes, to which the inductive coupling electrodes of the invention should not be limited but can also be properly exemplified by electrodes folded at centers, as shown in FIG. 8.

In this modification, too, the electrodes are provided at their two end portions with the feeding portions 9 and the grounding portion 10. The center-folded shape is exemplified by the shape of letter "U" or the rectangularly folded shape, which should not be limited to one folded rod but may be exemplified by a structure in which two straight electrodes are jointed and fixed with a metal plate or the like.

The distance between the feeding portion 9 and the grounding portion 10, and turning portion 15 are preferred to be n/2 times (n: a natural number) as long as the excitation wavelength $\lambda$ of the high-frequency power. Thus, the discharge can be stably generated and maintained.

Here, the feeding portion and the grounding portion need not always be disposed in the film forming chamber, as in the case of the rod-shaped electrodes. Moreover, the turning portion is exemplified by semicircular portions having a curvature in the case of the U-shape and by shorter straight portion between the two longer straight portions in the case of the rectangularly folded shape.

The high-frequency power source is properly exemplified by a high-frequency power source of a VHF band of 20 to 600 MHz, and the invention should not be limited thereto but can use microwaves. In the case using microwave, a conversion connector with the coaxial cable may be connected with the waveguide, and the coaxial cable may be connected with the feeding portion.

Figure 4A:
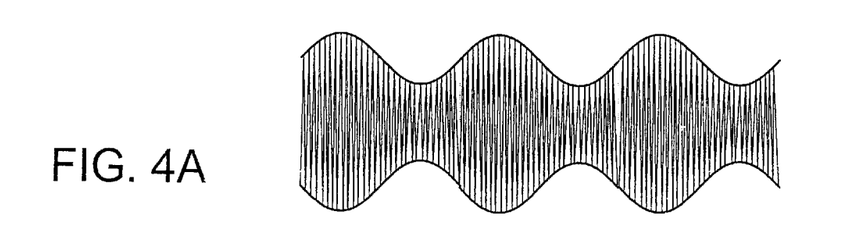
FIGS. 4(a) to 4(c) are conceptional diagrams showing amplitude-modulated high-frequency waveforms.
Figure 4B:
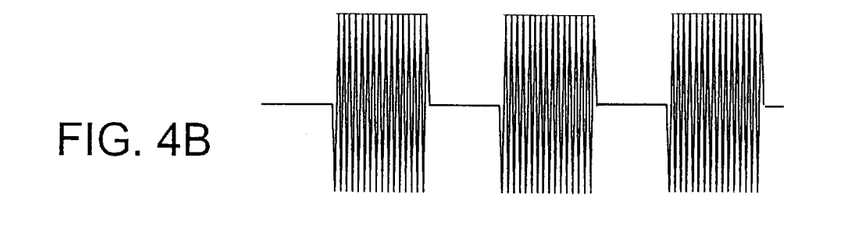
Figure 4C:
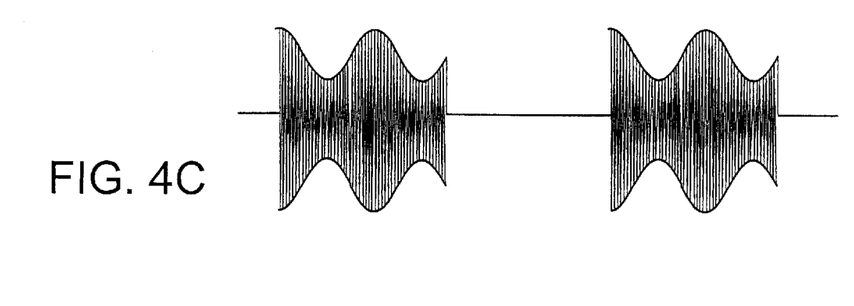

In this invention, moreover, the waveform generator 4 is provided for amplitude-modulating the high-frequency power. That is, the high-frequency power, as outputted from the high-frequency power source 3, is amplitude-modulated by the waveform generator 4 so that the high-frequency power having the waveforms, as illustrated in FIG. 4, is fed to the feeding portion of the inductive coupling electrodes. Here, the signal waves to modulate the high-frequency power may have any waveforms such as s sin wave (FIG. 4(a)), s rectangular wave, s triangular wave, a wave having waveform to cut off the output completely for a predetermined period (FIG. 4(b)), and a wave superposing the foregoing waves (FIG. 4(c)).

Figure 5:
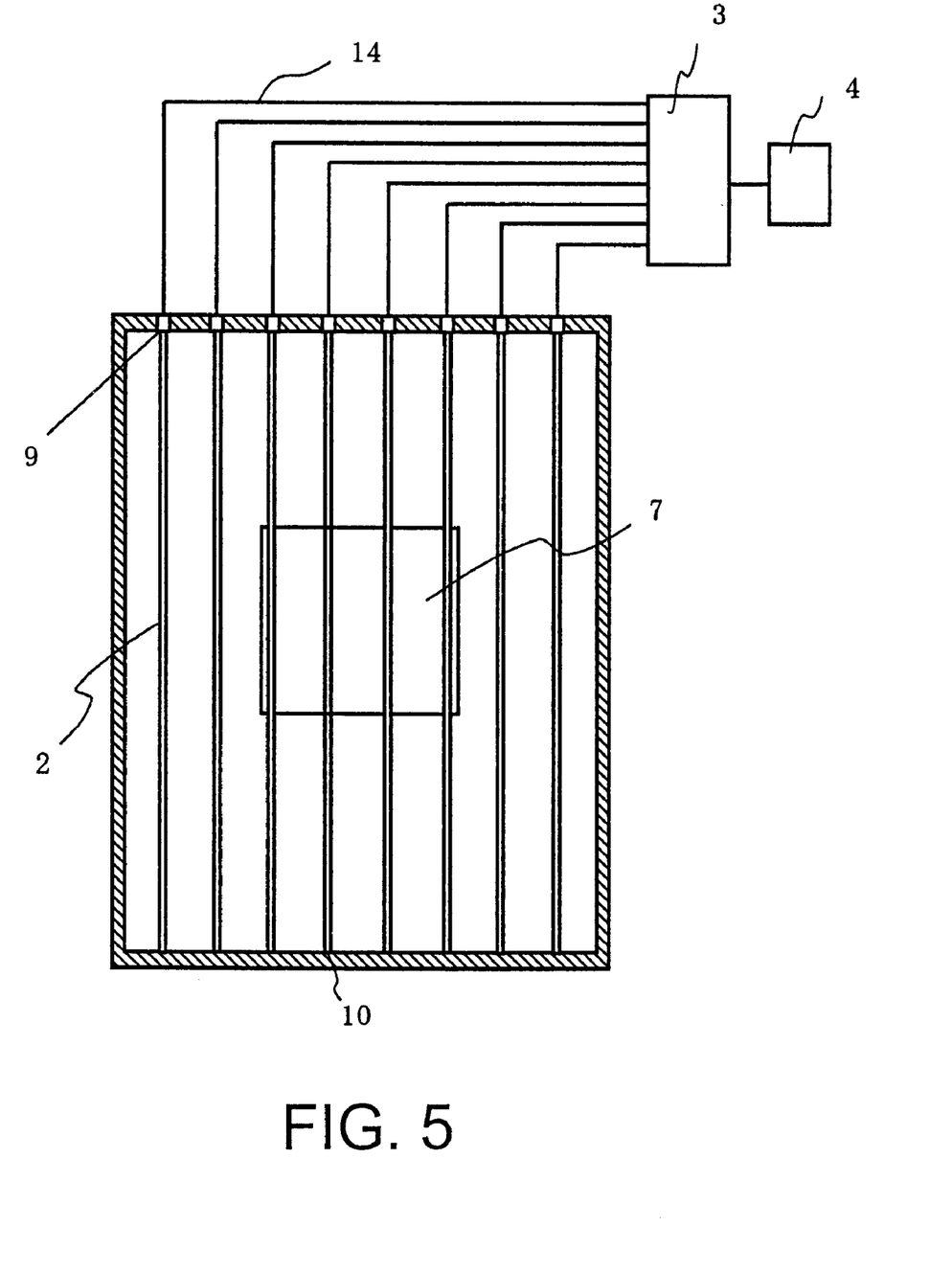
FIG. 5 is a schematic diagram showing an experimental system capable of amplitude-modulating a high-frequency power.

Here will be described the thin film forming method of the invention. In order to understand the invention easily, however, here will be additionally described the experiments which have been done in the course to the completion of the invention.

Where the apparatus of the construction shown in FIG. 5 is used, the film forming chamber 1 is evacuated at first to a high vacuum, and the substrate 7 is then heated to a predetermined temperature by the heater. Next, a reaction gas for the deposition is introduced at a predetermined flow rate into the film forming chamber, and the inside of the film forming chamber is set to a predetermined pressure by the main valve which is disposed in the exhaust port. Subsequently, the high-frequency power source 3 and the waveform generator 4 are turned ON to feed the inductive coupling electrode 2 with the high-frequency power which has been amplitude-modulated with the predetermined signal wave. Thus, a plasma is generated around the electrodes so that the reactive gas can be decomposed and activated to form a thin film having an excellently uniform thickness over the substrate 7.

The present inventors performed experiments to form the a-Si thin film over the substrate, by introducing a $S_iH_4$ gas into the film forming chamber of FIG. 5 and by amplitude-modulating the high-frequency power under various modulation conditions to generate the plasmas along the electrodes. As the electrodes, there were used in the experiments the rod-shaped electrodes having an outer diameter of 10 mm and a length of 1.6 m, and these eight electrodes were arranged to have a center distance of 32.5 mm. The electrode-substrate distance was 50 mm.

A substrate (having a length of 500 mm) 12 was arranged in the film forming chamber 1 and was heated to 200° C., and the $S_iH_4$ gas is introduced at 300 sccm to set the pressure at 5 Pa. The high-frequency powers, as modulated under the various conditions, were fed to the electrodes to generate the plasmas thereby to form the a-Si thin films over the substrates. Here: the high frequency was 80 MHz; the fed electric power was 31 W (for each electrode); and the high-frequency powers at the feeding portions of the individual electrodes were in phase.

The changes in the distribution of the plasma density according to the modulation conditions were visually observed, and the film thickness distributions of the a-Si films formed were measured. Examples of the results are plotted in FIGS. 6 and 7.

Figure 6A:
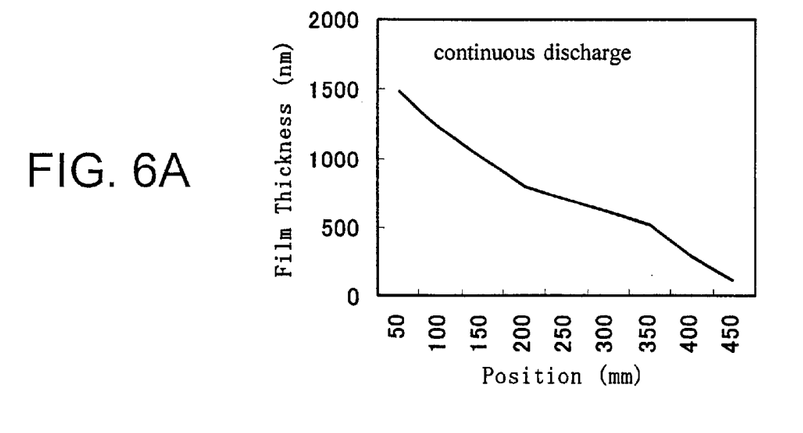
FIGS. 6(a) to 6(c) are graphs showing the relations between modulating conditions and film thickness distributions.
Figure 6B:
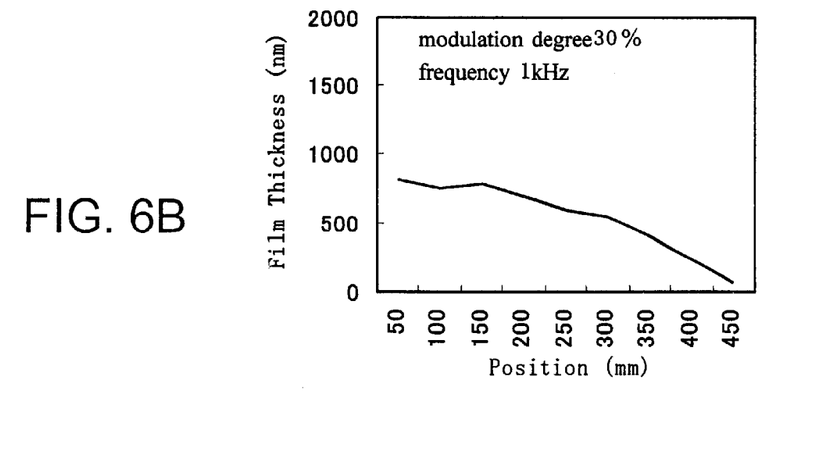
Figure 6C:
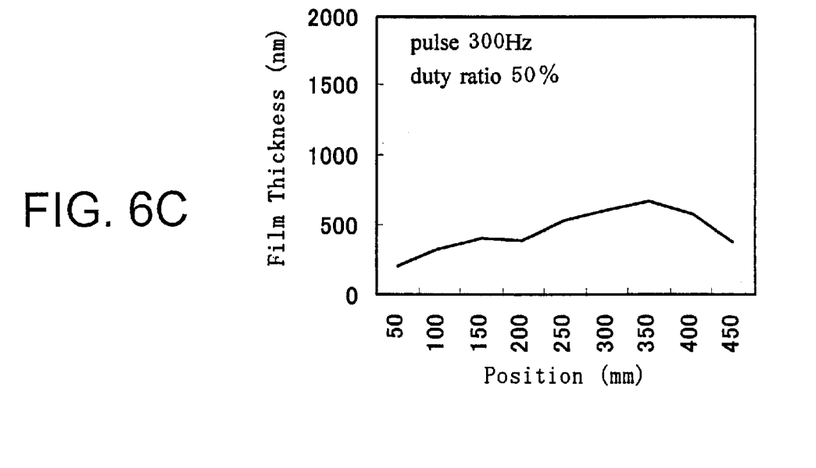
Figure 7A:
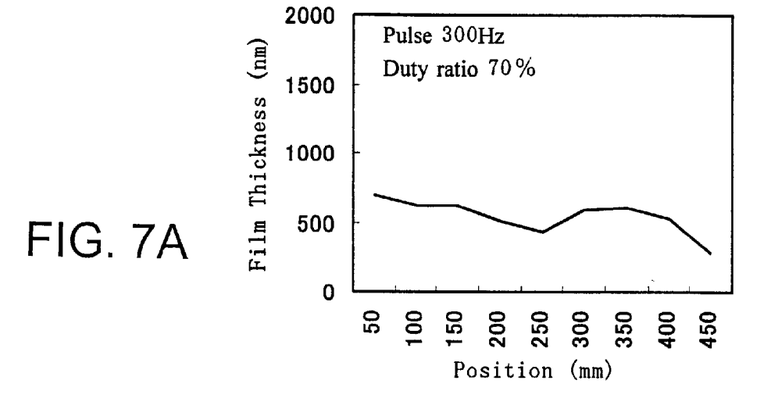
FIGS. 7(a) to 7(c) are graphs showing the relations between modulating conditions and film thickness distributions.
Figure 7B:
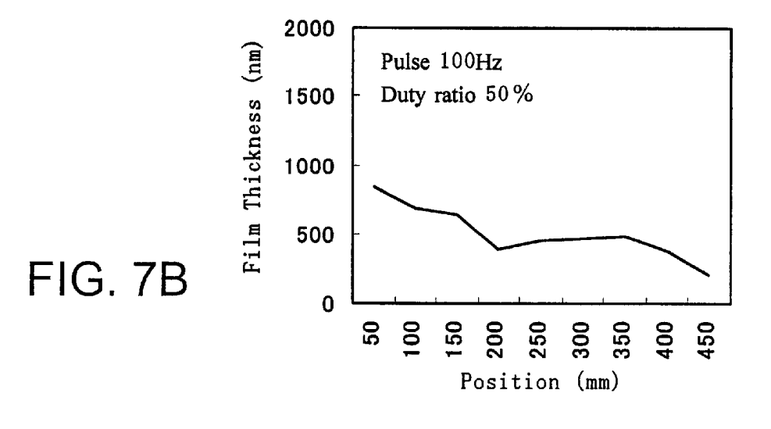

FIG. 6(a) is a graph plotting the film thickness distribution, as taken in the electrode direction, when the high-frequency power was fed (for continuous discharge) without any modulation to form the thin films. Here, the electrode center point corresponds to the position of 250 mm of the graph. FIGS. 6(b) and 6(c) plot the film thickness distributions when the a-Si thin films were formed by changing the percentage modulation and the modulation frequency, respectively. FIGS. 7(a) and 7(b) plot the film thickness distributions when the a-Si thin films were formed by changing the duty ratios (or pulse modulations).

Where the high-frequency power was fed without any amplitude modulation to the electrodes, there were observed the distributions of the plasma density which were brighter on the side of the feeding portions of the electrodes and darker on the side of the grounding portions, and the film thickness distribution was also thicker on the side of the feeding portions and the thinner to the end sides. Where the amplitude-modulated high-frequency waves were fed, on the contrary, the distributions of the plasma density were changed, and the film thickness distributions were also changed, as plotted in FIGS. 6(b) and 6(c) and FIGS. 7(a) and 7(b). In the case (of FIG. 6(b)) where the high-frequency power with a percentage modulation of 30% and a modulation frequency of 1 kHz was fed, for example, it has been found that the plasmas on the side of the feeding portions were darker than those of the case of the continuous discharge so that the film thickness distribution was changed according to the changes in the plasmas.

It has been found from the experimental results, as plotted, that the plasma density drops on the power feeding side as the percentage of the amplitude modulation is raised, and that the plasma density drops on the power feeding side but rises on the grounding side as the modulation frequency is raised. It has also been found that the plasma density rises on the power feeding side as the duty ratio (or the pulse modulation) is raised. In short, it has been clarified that the plasma density distribution along the electrodes and the film thickness distribution to be formed are changed by adjusting the modulation conditions properly. In other words, it has been found that a plasma of a desired distribution can be established to form a thin film having a desired uniform thickness by adjusting those parameters. Thus, the invention can be completed.

Figure 7C:
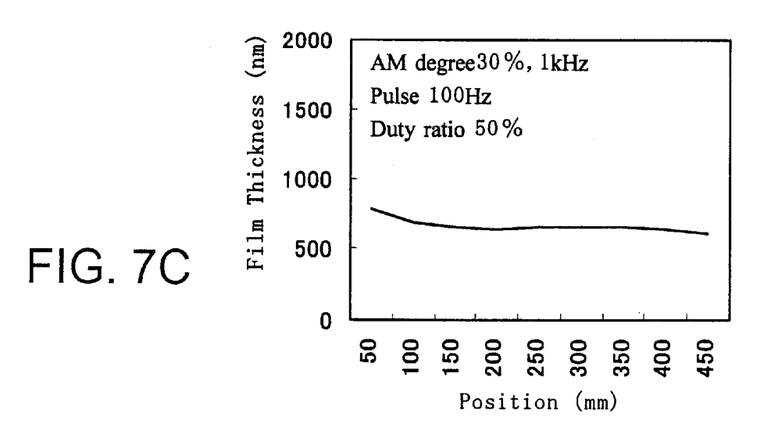

FIG. 7(c) plots the film thickness distribution at the time when the a-Si film was formed by adjusting the modulation conditions so as to homogenize the plasma density along the electrodes and by cutting off the feed of the high-frequency power periodically, as illustrated in FIG. 4(c). In the apparatus construction of FIG. 5, more specifically, it has been found that the a-Si film having an extremely excellent uniformity can be formed by superposing the pulse modulation over the amplitude modulation of 1 kHz.

On the other hand, it has been known that the distribution of the plasma density fluctuates with the film forming conditions such as the high-frequency power or the pressure. Therefore, the thin film forming apparatus of the prior art can form a film having a highly uniform thickness under certain conditions but is troubled by a problem that the uniform thickness cannot be achieved under the film forming conditions for a high quality film, for example. According to the invention, however, under any film forming conditions, the plasma density distribution change can be corrected by optimizing the amplitude modulations, to form the thin film which is excellent in the film thickness uniformity.

If the high-frequency power is increased for forming the film at a high rate, for example, the plasma density on the feeding portion side is higher than on the grounding portion side. In this case, the plasma density can be made uniform along the electrodes by raising the percentage of the amplitude modulation, by raising the modulation frequency or by lowering the duty ratio in the pulse modulation case, or by combining these methods. If the pressure is raised from the viewpoint of the film quality or the film forming rate, on the other hand, the plasma density on the feeding side becomes lower. Therefore, the reverse operations may be made to flatten the plasma density.

By any of the percentage of the amplitude modulation, the modulation frequency and the duty ratio or by combining them, as has been described hereinbefore, a thin film with uniform thickness can be formed under any film forming condition. According to the invention, therefore, it is possible to form a thin film with a high quality and a uniform thickness at a high rate.

Here, in the film forming method thus far described, the thin film may be formed by feeding the electrodes with the high-frequency power which has been amplitude-modulated by the modulation condition optimized in advance for the film forming condition, but the modulation condition may be changed during the film formation, observing the state of the plasma.

Even if the plasma density is largely distributed along the electrode, the uniform thickness film can also be prepared. In this case, the modulation conditions may be changed while the thin film is being formed, so that the film thickness may be finally uniform all over the substrate. It is preferable to change the modulation frequency of the amplitude modulation or the duty ratio of the pulses. By this film forming method, it is also possible to form a film having a different quality in the thickness direction, for example.

Another embodiment of the invention will be described with reference to FIG. 8.

In the film forming apparatus of this embodiment, as shown in FIG. 8, a plurality of U-shaped inductive coupling electrodes 2 are arranged in the film forming chamber 1 having the gas inlet 5 and the exhaust port 6. Each electrode is grounded by connecting its one end grounding portion 10 with the wall of the film forming chamber 1, and the feeding portion 9 at its other end is connected with the high-frequency power source 3 through the coaxial cable 14. In order to feed the high-frequency powers in anti-phase to the feeding portions of the adjacent electrodes, a phase shifter 13 is arranged between the feeding portion 9 and the high-frequency power source 3. With this high-frequency power source 3, moreover, there is connected the waveform generator 4 so that a desired amplitude modulation can be applied to the high-frequency power to be outputted from the power source 3.

The inductive coupling electrode 2 is exemplified by the U-shaped electrode which is folded back at its center, and is provided at its two end portions with the feeding portion 9 and the grounding portion 10. The distance L between the feeding portion 9 and the grounding portion 10, and the turning portion 15 is preferred to be n/2 times (n: a natural number) as long as the excitation wavelength $\lambda$ of the high-frequency power.

Figure 9:
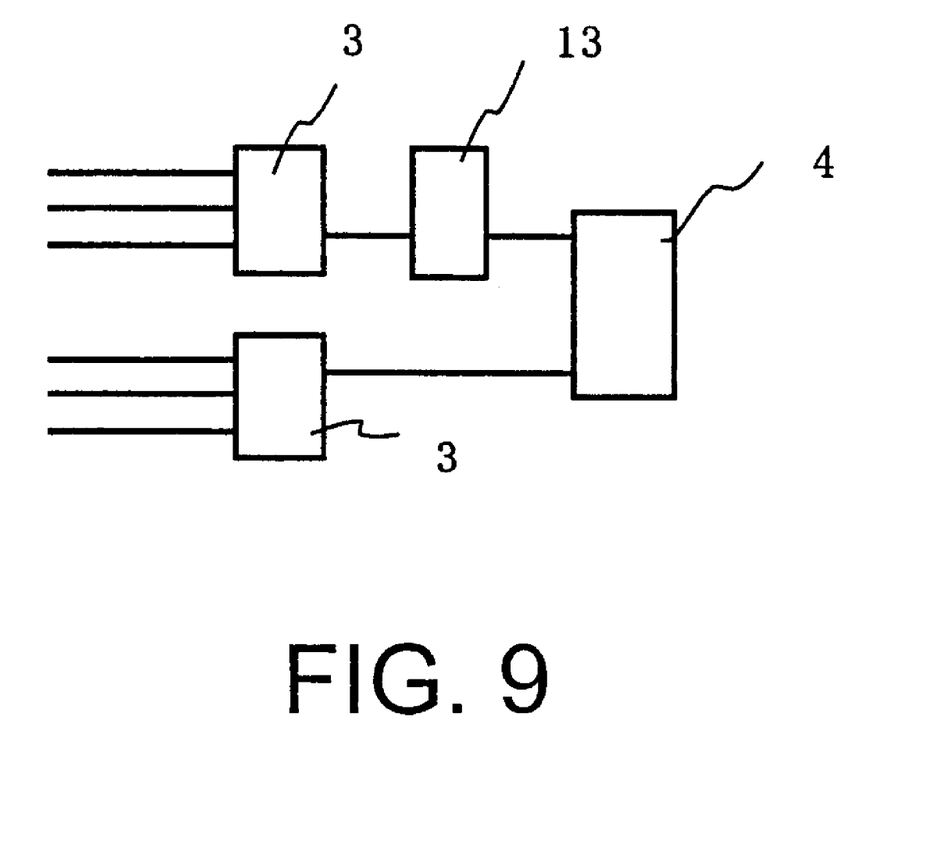
FIG. 9 is a schematic diagram showing another example of a feed system of a high-frequency power of the invention.

In FIG. 8, the phase shifter 13 for controlling the phase of high-frequency power is arranged as the means for feeding the high-frequency waves in anti-phase to the feeding portions of the adjacent ones of the plurality of inductive coupling electrodes. For these phase shifters 13, not only the arrangement shown in FIG. 8 but also the arrangement of FIG. 9 is properly used where the number of electrodes is large as in the case of FIG. 3. In the arrangement of FIG. 8, the number of phase shifters becomes the larger for the larger number of electrodes, and all of the phase shifters have to be individually adjusted to control the phases of the adjacent electrodes. In the arrangement of FIG. 9, on the other hand, only one phase shifter 13 is sufficient irrespective of the number of electrodes, so that the system can be simplified. Therefore, the phase adjustment may be made for the single phase shifter.

By using no phase shifter, on the other hand, the phases of the feeding portions of the adjacent electrodes can be inverted. In this case, for example, the distance between the feeding portion and the turning portion are elongated alternately of the plurality of electrodes to a half wavelength of the high-frequency wave, and the feeding portions are disposed outside of the film forming chamber. Alternatively, a coaxial cable equivalent to the half wavelength may be added to each feeding portion.

Here will be described the thin film forming method using the apparatus of FIG. 8.

First of all, the film forming chamber 1 is evacuated, and the substrate 7 is then heated by the (not-shown) heater to a predetermined temperature. Next, the reactive gas for the deposition is introduced at a predetermined flow rate into the film forming chamber, and the inside of film forming chamber is set to a predetermined pressure by the main valve which is disposed in the exhaust port 6.

The high-frequency power source 3 and the waveform generator 4 are turned ON, and the high-frequency power are amplitude-modulated with a predetermined signal wave. By observing the (not-shown) waveform monitor disposed in the feeding portion or the like, the phases of the feeding portions of the adjacent electrodes are adjusted to take a phase shift of 180 degrees by the phase shifters. When the high-frequency power is thus fed to the individual inductive coupling electrodes 2, the plasmas with uniform density are generated around the electrodes to decompose and activate the reactive gas so that a thin film having an excellently uniform thickness can be formed over the substrate 7.

Figure 10A:
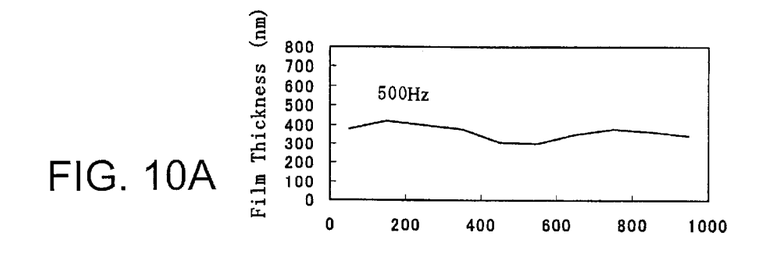
FIGS. 10(a) to 10(e) are graphs showing the relations between modulating conditions and high-frequency powers, and film thickness distributions.
Figure 10B:
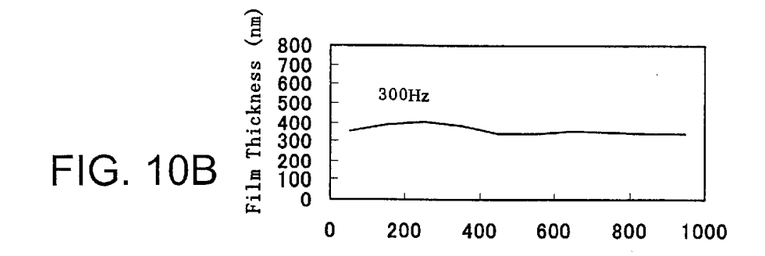
Figure 10C:
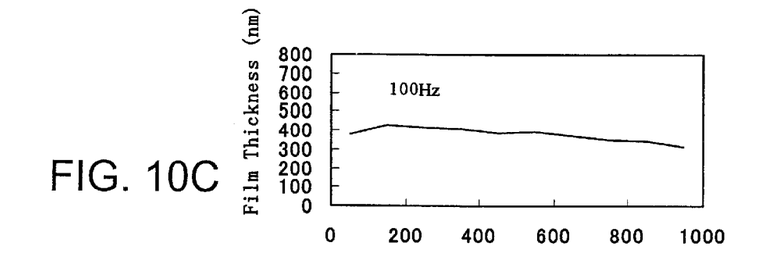
Figure 10D:
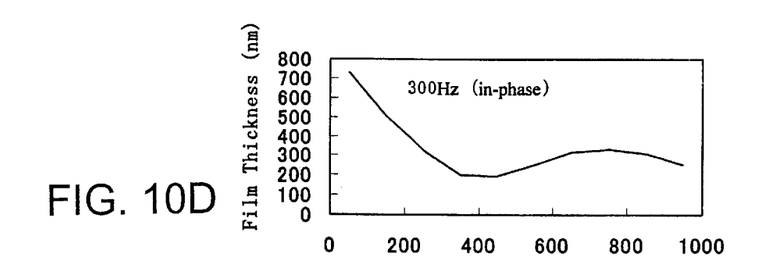
Figure 10E:
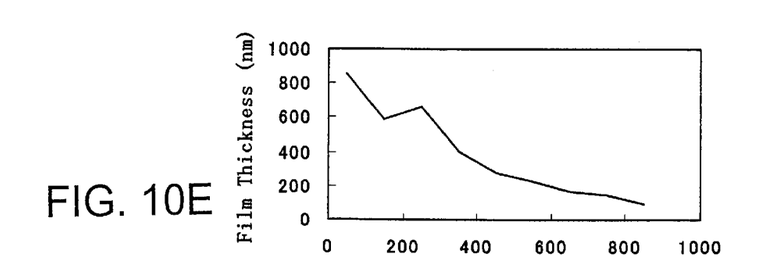

Here will be specifically described the behaviors in which the film thickness distribution is changed by the modulation condition and the phase of the high-frequency wave. FIGS. 10(a) to 10(e) are graphs plotting the film thickness distributions which were measured in the longitudinal direction of the electrodes when the a-Si films were formed under the following film forming conditions. FIGS. 10(a) to 10(c) plot the film thickness distributions which were obtained when the pulses were modulated with different frequencies and when the high-frequency waves in anti-phase were fed to the adjacent electrodes. On the other hand, FIGS. 10(d) and 10(e) plot the film thickness distributions which were obtained when the in-phase high-frequency power was fed to the individual electrodes and with the pulse modulation (FIG. 10(d)) of 300 Hz and in the continuous discharge (FIG. 10(e)) with no modulation.

(Film Forming Conditions)

Electrodes:
Eight U-shaped electrodes (of 10 mm dia.) Distance between the feeding portion and the turning portion: 1.35 m Substrate:
1.0 m×0.5 m High Frequency Wave:
81 MHz, 25 W (for each)

Modulation:
Pulse frequency of 100, 300 and 500 Hz Duty ratio of 50%

Gas:
$S_iH_4$, 300 sccm

Pressure:
5 Pa

Where the in-phase high-frequency power is fed to the all the electrodes, the film thickness distribution was such that the film thickness was large on the feeding portion side, reduced toward the turning portion, then increased to the maximum, and reduced again. This film thickness distribution is observed where the in-phase high-frequency wave is fed to form a film on a large-sized substrate (1 m) as large as the electrode length (1.35 m). Where the high-frequency waves in anti-phase are fed to the adjacent electrodes, on the contrary, a generally flattened distribution can be obtained, as compared with the case of the in-phase. It is also found that the relative film thickness ratio is given a tendency to change between the feeding portion side and the end side (folded portion side) of the electrodes by changing the frequency of the pulse modulation.

As apparent from the description thus far made, by arranging the plurality of U-shaped electrodes, by feeding the high-frequency waves in the anti-phase to the feeding portions of the adjacent electrodes and by selecting the amplitude modulation conditions properly, the plasma density can be made uniform under the various film forming conditions so that a thin film having an excellently uniform thickness can be formed even over a large-sized substrate of 1 m or more.

In the example of FIG. 10, there is illustrated the effect which was obtained by using the pulse modulation as the amplitude modulation and by changing the frequency. However, similar effects can also be obtained, as described hereinbefore, by using the modulation parameters such as the percentage modulation or the duty ratio other than the modulation frequency. By combining the amplitude modulation and the phase control, therefore, the uniform film thickness can be achieved over the large-sized substrate under any film forming conditions.

The thin film forming apparatus and method of the invention have been described mainly on the case in which the invention is applied to the a-Si film. However, it is quite natural that the invention can be applied not only to the a-Si film but also the various thin films by selecting the reactive gases.

By amplitude-modulating the high-frequency power and by making the high-frequency powers in anti-phase between the adjacent feeding portions of electrodes, it is possible to form a semiconductor thin film of a high quality at a high rate. Moreover, this film has an excellent thickness uniformity so that the present invention can be properly used for manufacturing solar cells of the large-sized substrate. By adopting the aforementioned multi-zone film forming method, moreover, the films can be simultaneously formed on a number of substrates without inviting the size enlargement of the apparatus. As a result, the films can be formed with high throughput to achieve the highest target, i.e., to lower the cost for spreading the use of solar cells.

In the invention, the solar cells may be constructed to have the p-i-n structure, the p-n structure or the tandem structure having the foregoing structures laminated. The thin film forming method and the thin film forming apparatus of the present invention can be applied to those p-layer, i-layer and n-layer.

As has been described hereinbefore, a thin film having an excellent thickness uniformity can be formed on a large-sized substrate by the thin film forming method and the thin film forming apparatus of the invention. Moreover, it is possible to provide a thin film forming apparatus which has a high throughput ratio to the apparatus installation area.

What is claimed is:

1. A method of forming a thin film on a substrate comprising:

arranging an inductive coupling electrode in a film forming chamber, the inductive coupling electrode having a power feeding portion at a first end and a grounding portion at a second end; and feeding a high-frequency power to said feeding portion to generate plasma to form the thin film on a thin film forming area where at least one substrate is placed facing said electrode, wherein said electrode has an electrode length which is longer than a length of the thin film forming area in a direction along the electrode, and said electrode is arranged in plurality with an interval so as to cover the thin film forming area, and said high-frequency power is amplitude-modulated and fed simultaneously to the feeding portions of said plurality of electrodes.

2. The method according to claim 1, wherein said electrode is selected from the group consisting of a straight-line electrode and an electrode which is folded back at its center having a turning portion, the electrode having a first side and a second side.

3. The method according to claim 1, wherein said length of the thin film forming area in the direction along the electrode is 50 cm or longer.

4. The method according to claim 2, further comprising:

adjusting the frequency of the high-frequency power to establish a standing wave between the feeding portion and the grounding portion or between the feeding portion and the turning portion of said electrode.

5. The method according to claim 2, wherein a phase of the high-frequency power is made in anti-phase between adjacent feeding portions of said plurality of electrodes.

6. The method according to claim 3, wherein a phase of the high-frequency power is made in anti-phase between adjacent feeding portions of said plurality of electrodes.

7. The method according to claim 4, wherein a phase of the high-frequency power is made in anti-phase between adjacent feeding portions of said plurality of electrodes.

8. The method according to claim 5, wherein said electrodes have a plurality of planes arranged in a plurality of layers, and wherein substrates are arranged on the first and second sides of each electrode layer so that thin films are simultaneously formed on the plurality of the substrates.

9. The method according to claim 8, wherein a distance between said electrode and the substrate is 30 to 60 mm.

10. The method according to claim 3, wherein said amplitude modulation periodically cuts off the feed of the high-frequency power.

11. The method according to claim 10, wherein a duty ratio of said amplitude modulation is varied while the thin film is being formed.

12. The method according to claim 3, wherein the modulation frequency of said amplitude modulation is varied while the thin film is being formed.

13. The method according to claim 3, wherein a thin film of amorphous silicon is formed on the substrate.

14. A method of forming a thin film on a large area substrate comprising:

arranging an inductive coupling electrode in a film forming chamber, the inductive coupling electrode having a power feeding portion at a first end and a grounding portion at a second end; and feeding a high-frequency power to said feeding portion to generate plasma to form the thin film on a thin film forming area where at least one substrate is placed facing said electrode, wherein said electrode has a straight-line geometry and has a length between the feeding portion and grounding portion of 1.6 meters or longer, said electrode arranged in plurality with an interval so as to cover the thin film forming area, and said high-frequency power is amplitude-modulated and fed simultaneously to the feeding portions of said plurality of electrodes.

15. The method according to claim 14, further comprising:

adjusting the frequency of the high-frequency power to establish a standing wave between the feeding portion and the grounding portion of said electrode.

16. The method according to claim 14, wherein said amplitude modulation periodically cuts off the feed of the high-frequency power.

17. A method of forming a thin film on a large area substrate comprising:

arranging an inductive coupling electrode in a film forming chamber, the inductive coupling electrode having a power feeding portion at a first end and a grounding portion at a second end; and feeding a high-frequency power to said feeding portion to generate plasma to form the thin film on a thin film forming area where at least one substrate is placed facing said electrode, wherein said electrode is folded back at its center having a turning portion, the electrode having a first side and a second side and a length between the feeding portion and the turning portion of 1.35 meters or longer, said electrode arranged in plurality with an interval so as to cover the thin film forming area, and said high-frequency power is amplitude-modulated and fed simultaneously to the feeding portions of said plurality of electrodes.

18. The method according to claim 17, further comprising:

adjusting the frequency of the high-frequency power to establish a standing wave between the feeding portion and the turning portion of said electrode.

19. The method according to claim 17, wherein a phase of the high-frequency power is made in anti-phase between adjacent feeding portions of said plurality of electrodes.

20. The method according to claim 18, wherein a phase of the high-frequency power is made in anti-phase between adjacent feeding portions of said plurality of electrodes.

21. The method according to claim 19, wherein said electrodes have a plurality of planes arranged in a plurality of layers, and wherein substrates are arranged on the first and second sides of each electrode layer so that thin films are simultaneously formed on the plurality of substrates.

22. The method according to claim 17, wherein said amplitude modulation periodically cuts off the feed of the high-frequency power.

23. The method according to claim 17, wherein a thin film of amorphous silicon is formed on the substrate.

* * * * *